US012784690B2

(12) United States Patent
Kim et al.

(10) Patent No.: US 12,784,690 B2
(45) Date of Patent: Nov. 3, 2026

(54) DRIVING CIRCUIT

(71) Applicant: Samsung Display Co., LTD., Yongin-si (KR)

(72) Inventors: Kyungho Kim, Yongin-si (KR); Sangyong No, Yongin-si (KR); Nahyeon Cha, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 19/013,360

(22) Filed: Jan. 8, 2025

(65) Prior Publication Data

US 2025/0273160 A1 Aug. 28, 2025

(30) Foreign Application Priority Data

Feb. 27, 2024 (KR) ........................ 10-2024-0028159

(51) Int. Cl.
*G09G 3/3266* (2016.01)
*H03K 17/687* (2006.01)

(52) U.S. Cl.
CPC ....... *G09G 3/3266* (2013.01); *H03K 17/6872* (2013.01); *G09G 2310/0286* (2013.01)

(58) Field of Classification Search
CPC ......... G09G 3/3266; G09G 2310/0286; H03K 17/6872; G11C 19/28
See application file for complete search history.

(56) References Cited

U.S. PATENT DOCUMENTS

| | | | | |
|---|---|---|---|---|
| 10,319,283 | B2 | 6/2019 | Kim et al. | |
| 10,706,784 | B2 * | 7/2020 | Kim | G09G 3/3677 |
| 2014/0313174 | A1 * | 10/2014 | Murakami | G11C 19/28 377/80 |
| 2022/0208075 | A1 | 6/2022 | Kim et al. | |
| 2024/0265873 | A1 * | 8/2024 | Chen | H10D 86/425 |

FOREIGN PATENT DOCUMENTS

| | | | |
|---|---|---|---|
| CN | 116486731 | A | 7/2023 |
| KR | 1020220094916 | A | 7/2022 |
| KR | 102471098 | B1 | 11/2022 |
| KR | 102487109 | B1 | 1/2023 |

* cited by examiner

*Primary Examiner* — Sardis F Azongha

(74) *Attorney, Agent, or Firm* — CANTOR COLBURN LLP

(57) ABSTRACT

A driving circuit may include a plurality of stages, where a pull-down transistor of each of the plurality of stages is implemented as a transmission gate. The transmission gate may include a P-channel first sub-transistor and an N-channel second sub-transistor connected in parallel with each other, and a gate of the N-channel second sub-transistor and a gate of a pull-up transistor may be connected to a same node.

20 Claims, 11 Drawing Sheets

DRIVING CIRCUIT

DRIVING CIRCUIT

This application claims priority to Korean Patent Application No. 10-2024-0028159, filed on Feb. 27, 2024, and all the benefits accruing therefrom under 35 U.S.C. § 119, the content of which in its entirety is herein incorporated by reference.

BACKGROUND

1. Field

One or more embodiments relate to a driving circuit (gate driving circuit) and a display apparatus including the gate driving circuit.

2. Description of the Related Art

A display apparatus typically includes a pixel area including a plurality of pixels, a gate driving circuit, a data driving circuit, a controller, or the like. The gate driving circuit includes stages respectively connected to gate lines, and the stages respectively supply gate signals to the gate lines in response to signals received from the controller.

SUMMARY

One or more embodiments include a driving circuit capable of stably outputting a gate signal and a display apparatus including the driving circuit.

According to one or more embodiments, a driving circuit includes a plurality of stages, wherein each of the plurality of stages includes a first transistor connected to a first terminal, to which a start signal is input, and a first node, where the first transistor includes a gate connected to a clock terminal to which a clock signal is input, a pull-up up transistor connected to a second terminal, to which a first voltage is supplied, and an output terminal, a pull-down transistor connected to the output terminal and a third terminal, to which a second voltage less than the first voltage is supplied, and a control circuit connected to the first node, a gate of the pull-down transistor, and a gate of the pull-up transistor, where the control circuit controls a voltage of the gate of the pull-down transistor and a voltage of the gate of the pull-up transistor based on a voltage of the first node, wherein the pull-down transistor comprises a first sub-transistor and a second sub-transistor connected in parallel with each other, and conductivity types of the first sub-transistor and the second sub-transistor are different from each other, where a gate of the second sub-transistor and the gate of the pull-up transistor are connected to a same node.

In an embodiment, the first sub-transistor may be a P-channel transistor, and the second sub-transistor may be an N-channel transistor.

In an embodiment, each of the plurality of stages may further include a first capacitor connected to the output terminal and a second node, to which a gate of the first sub-transistor is connected.

In an embodiment, the control circuit may include a second transistor connected to the first node and the second node, where the second transistor includes a gate connected to the third terminal, a third transistor connected to the second terminal and a third node to which the gate of the second sub-transistor is connected, where the third transistor includes a gate connected to the first node, a fourth transistor connected to the third node and the third terminal, where the fourth transistor includes a gate connected to the second node, and a second capacitor connected to the second terminal and the third node.

In an embodiment, in each of the plurality of stages, the fourth transistor and the second sub-transistor may be N-channel transistors, and remaining transistors may be P channel transistors.

In an embodiment, while a low-level output signal is output from the output terminal, voltages of the first node and the second node may be at a low level and a voltage of the third node may be at a high level, and a voltage level of the second node may be lower than a voltage level of the first node.

In an embodiment, while a high-level output signal is output from the output terminal, voltages of the first node and the second node may be at a high level and a voltage of the third node may be at a low level.

In an embodiment, the clock signal is a first clock signal or a second clock signal, wherein the first clock signal and the second clock signal are signals in which a high-level voltage and a low-level voltage are alternate, and the second clock signal is a signal shifted by a half cycle from the first clock signal, wherein the first clock signal may be input to the clock terminal of each of odd-numbered stages among the plurality of stages, and the second clock signal may be input to the clock terminal of each of even-numbered stages among the plurality of stages.

In an embodiment, while a low-level output signal is output from the output terminal in a low-frequency driving mode, the clock signal input to the clock terminal may be a high-level signal.

In an embodiment, the start signal may be an external signal or a signal output from an output terminal of a previous stage.

According to one or more embodiments, a driving circuit includes a plurality of stages, where each of the plurality of stages includes a first transistor connected to a first terminal to which a start signal is input and a first node, where the first transistor includes a gate connected to a clock terminal, to which a clock signal is input, a second transistor connected to the first node and a second node, where the second transistor includes a gate connected to a second terminal, to which a first voltage is supplied, a third transistor connected to a third node and a third terminal, to which a second voltage greater than the first voltage is supplied, where the third transistor includes a gate connected to the first node, a fourth transistor connected to the third node and the second terminal, where the fourth transistor includes a gate connected to the second node, a fifth transistor connected to the third terminal and an output terminal, where the fifth transistor includes a gate connected to the third node, and a transmission gate connected to the output terminal and the second terminal. In such an embodiment, the transmission gate includes a first sub-transistor and a second sub-transistor connected in parallel with each other, a gate of the first sub-transistor is connected to the second node, and a gate of the second sub-transistor is connected to the third node.

In an embodiment, the first sub-transistor may be a P-channel transistor, and the second sub-transistor may be an N-channel transistor.

In an embodiment, each of the plurality of stages may further include a first capacitor connected to the third terminal and the third node, and a second capacitor connected to the output terminal and the second node.

In an embodiment, while a low-level output signal is output from the output terminal, voltages of the first node and the second node may be at a low level and a voltage of the third node may be at a high level, and a voltage level of the second node may be lower than a voltage level of the first node.

In an embodiment, while a high-level output signal is output from the output terminal, voltages of the first node and the second node may be at a high level and a voltage of the third node may be at a low level.

In an embodiment, in each of the plurality of stages, conductivity types of the fourth transistor and the second sub-transistor may be opposite to conductivity types of remaining transistors.

In an embodiment, in each of the plurality of stages, the fourth transistor and the second sub-transistor may be N-channel transistors, and the remaining transistors may be P-channel transistors.

In an embodiment, the clock signal is a first clock signal or a second clock signal, wherein the first clock signal and the second clock signal are signals in which a high-level voltage and a low-level voltage are alternate, and the second clock signal is a signal shifted by a half cycle from the first clock signal, wherein the first clock signal may be input to the clock terminal of each of odd-numbered stages among the plurality of stages, and the second clock signal may be input to the clock terminal of each of even-numbered stages among the plurality of stages.

In an embodiment, while a low-level output signal is output from the output terminal in a low-frequency driving mode, the clock signal input to the clock terminal may be a high-level signal.

In an embodiment, the start signal may be an external signal or a signal output from an output terminal of a previous stage.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
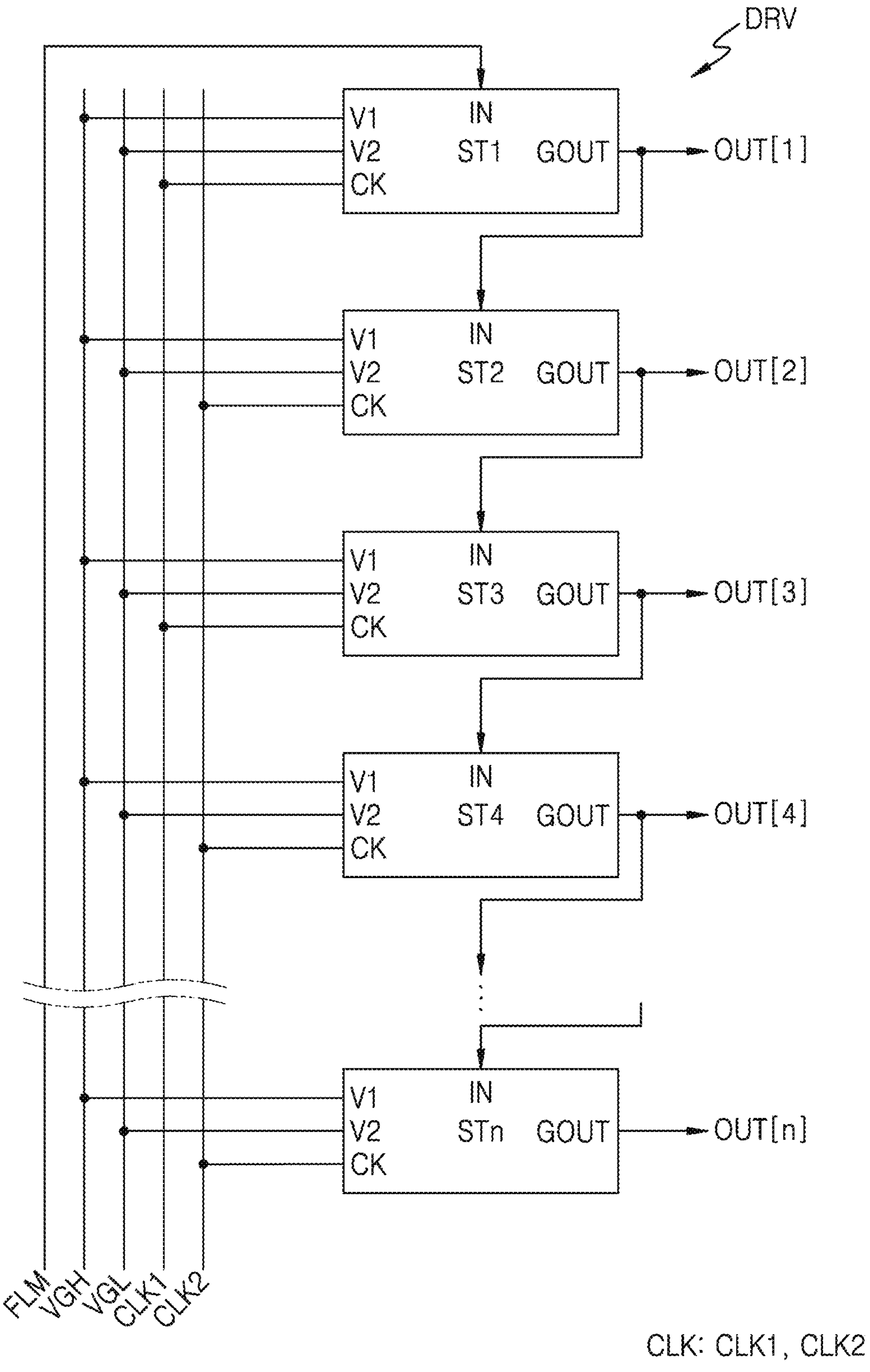
FIG. 1 is a schematic diagram of a driving circuit according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "a first component," "a first region," "a first layer" or "a first section" discussed below could be termed a second element, a second component, a second region, a second layer or a second section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. Thus, reference to "an" element in a claim followed by reference to "the" element is inclusive of one element and a plurality of the elements. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" or "at least one selected from a, b and c" indicates only a, only b, only c, both a and b, both a and c, both b and c, all of a, b, and c, or variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Sizes of elements in the drawings may be exaggerated or reduced for convenience of explanation. As an example, the size and thickness of each element shown in the drawings are arbitrarily represented for convenience of description, and thus, the present disclosure is not necessarily limited thereto. Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the following embodiments, when X and Y are connected to each other, this may include a case where X and Y are physically connected to each other, a case where X and Y are functionally connected to each other, and a case where X and Y are electrically connected to each other. Also, when X and Y are connected to each other, this may include a case where X and Y are directly connected to each other and a case where X and Y are indirectly connected to each other with another element therebetween. In this regard, X and Y may be elements, for example, apparatuses, devices, circuits, wires, electrodes, terminals, films, layers, areas, or the like. Accordingly, X and Y are not limited to preset connection relationships and connection relationships shown and made in the drawings and the detailed description, but may include connection relationships other than the connection relationships shown and made in the drawings and the detailed description.

For example, when X and Y are electrically connected to each other, this may include a case where X and Y are directly electrically connected to each other and/or a case where X and Y are indirectly electrically connected to each other with another element therebetween. When X and Y are indirectly electrically connected to each other, this may include a case where one or more elements (e.g., switches, transistors, capacitive elements, inductors, resistance elements, diodes, etc.) that enable electrical connection between X and Y are connected between X and Y.

In embodiments below, "ON" used in association with an element state may denote an active state of an element, and "OFF" may denote an inactive state of an element. "ON" used in association with a signal received by an element may denote a signal activating the element, and "OFF" may denote a signal inactivating the element. An element may be activated by a high-level voltage or a low-level voltage. As an example, a P-channel transistor (a P-type transistor) may be activated by a low-level voltage, and an N-channel transistor (an N-type transistor) may be activated by a high-level voltage. Accordingly, it should be understood that "ON" voltages for a P-channel transistor and an N-channel transistor are opposite (low vs. high) voltage levels. Hereinafter, a voltage that activates (turns on) a transistor is referred to as a gate-on voltage, and a voltage that deactivates (turns off) a transistor is referred to as a gate-off voltage.

Figure 2:
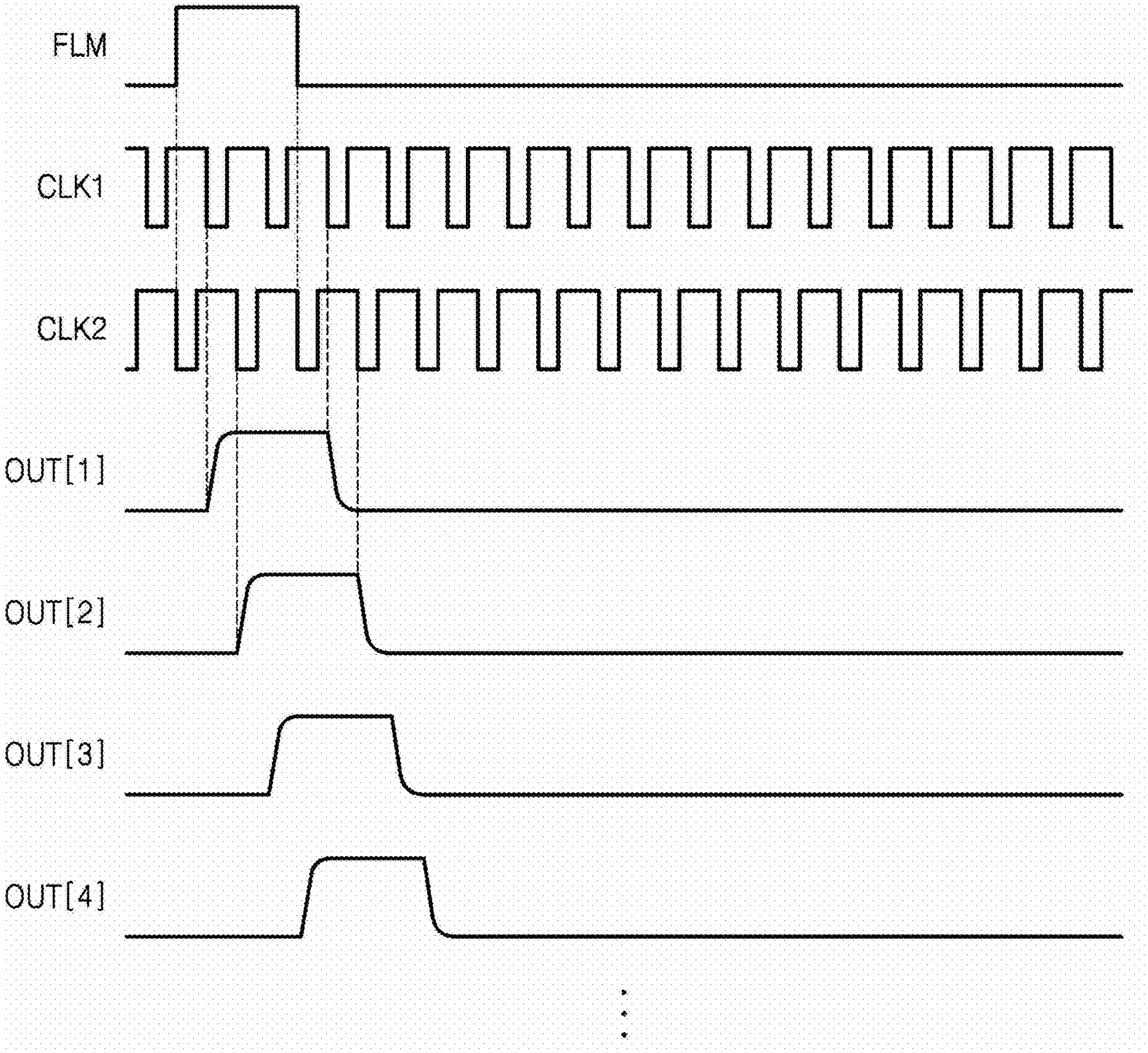
FIG. 2 is a schematic diagram showing input and output signals of a driving circuit according to an embodiment.

FIG. 1 is a schematic diagram of a driving circuit according to an embodiment. FIG. 2 is a schematic diagram showing input and output signals of a driving circuit, according to an embodiment.

Referring to FIG. 1, a driving circuit DRV according to an embodiment may include a plurality of stages ST1 to STn. The plurality of stages ST1 to STn may be configured to sequentially output output signals OUT[1], OUT[2], OUT[3], OUT[4], . . . , and OUT[n] to signal lines, respectively. Herein, n may be a natural number greater than 0.

The stages ST1 to STn may be connected to the signal lines, respectively. Each of the stages ST1 to STn may be configured to receive at least one clock signal and at least one voltage signal, generate an output signal OUT, and output the output signal OUT to a connected signal line. Each of the stages ST1 to STn−1 may output an output signal to a subsequent stage. Hereinafter, an output signal output by a previous stage and received by the current stage may be referred to as a previous output signal.

The stages ST1 to STn may include a plurality of terminals to and from which a plurality of signals are input and output, respectively. The plurality of signals may include a clock signal and a voltage signal. The plurality of terminals may include an input terminal IN, a first voltage input terminal V1, a second voltage input terminal V2, a clock terminal CK, and an output terminal GOUT.

A start signal may be input (supplied) to the input terminal IN. The plurality of stages ST1 to STn may respectively output the output signals OUT[1], OUT[2], OUT[3], OUT[4], . . . , and OUT[n] in response to the start signal. The start signal may be an external signal FLM or a previous output signal. The external signal FLM may be input as the start signal to an input terminal IN of the first stage ST1, and the previous output signal may be input as the start signal to an input terminal IN of each of the second to n-th stages ST2 to STn. A previous stage may be a stage located at least one stage prior to a current stage. FIG. 1 shows an embodiment in which the previous stage is located immediately before the current stage. In such an embodiment, for example, as the start signal, the third output signal OUT[3] output from the third stage ST3 may be input to an input terminal IN of the fourth stage ST4.

A first voltage VGH may be input to the first voltage input terminal V1, and a second voltage VGL may be input to the second voltage input terminal V2. The second voltage VGL may have a lower voltage level than the first voltage VGH. In an embodiment, the first voltage VGH may be a positive voltage and the second voltage VGL may be a negative voltage. In an embodiment, a high-level voltage and a low-level voltage may mean a positive voltage and a negative voltage, respectively, but are not limited thereto. For example, a relatively higher voltage among two voltages may be referred to as the high-level voltage, and a relatively lower voltage among the two voltages may be referred to as the low-level voltage.

A clock signal CLK may be input to the clock terminal CK. The clock signal CLK may include a first clock signal CLK1 and a second clock signal CLK2. The first clock signal CLK1 or the second clock signal CLK2 may be input to the clock terminal CK. The first clock signal CLK1 may be input to clock terminals CK of odd-numbered stages ST1, ST3, . . . . The second clock signal CLK2 may be input to clock terminals CK of even-numbered stages ST2, ST4, . . . .

As shown in FIG. 2, the first clock signal CLK1 and the second clock signal CLK2 may be square wave signals that repeat a high-level voltage and a low-level voltage. In an embodiment, the first clock signal CLK1 and the second clock signal CLK2 may be square wave signals that repeat the first voltage VGH and the second voltage VGL. The first clock signal CLK1 and the second clock signal CLK2 may be signals that have a same waveform and are phase-shifted. In an embodiment, for example, the second clock signal CLK2 may have a same waveform as the first clock signal CLK1 and may be input by being phase-shifted (phase-delayed) at certain intervals. The second clock signal CLK2 may be shifted by a ½ cycle with respect to the first clock signal CLK1. In an embodiment, in the first clock signal CLK1 and the second clock signal CLK2, a duration (hereinafter, referred to as a high-level duration) during which a high-level voltage is maintained and a duration (hereinafter, referred to as a low-level duration) during which a low-level voltage is maintained for one cycle may be the same as each other. In an embodiment, in the first clock signal CLK1 and the second clock signal CLK2, the high-level duration may be longer than the low-level duration for one cycle.

An output signal may be output from the output terminal GOUT. In an embodiment, as shown in FIG. 2, the output signals OUT[1], OUT[2], OUT[3], OUT[4], . . . , and OUT[n] output from output terminals GOUT of the stages ST1 to STn may be sequentially shifted by a certain period. In an embodiment, the stages ST1 to STn may be configured to shift the output signals OUT[1], OUT[2], OUT[3], OUT[4], . . . , and OUT[n] each having a high-level voltage by a ½ cycle of the clock signal and sequentially output the same as each other. In an embodiment, the high-level voltage and the low-level voltage of the output signals may be the first voltage VGH and the second voltage VGL, respectively.

Figure 3:
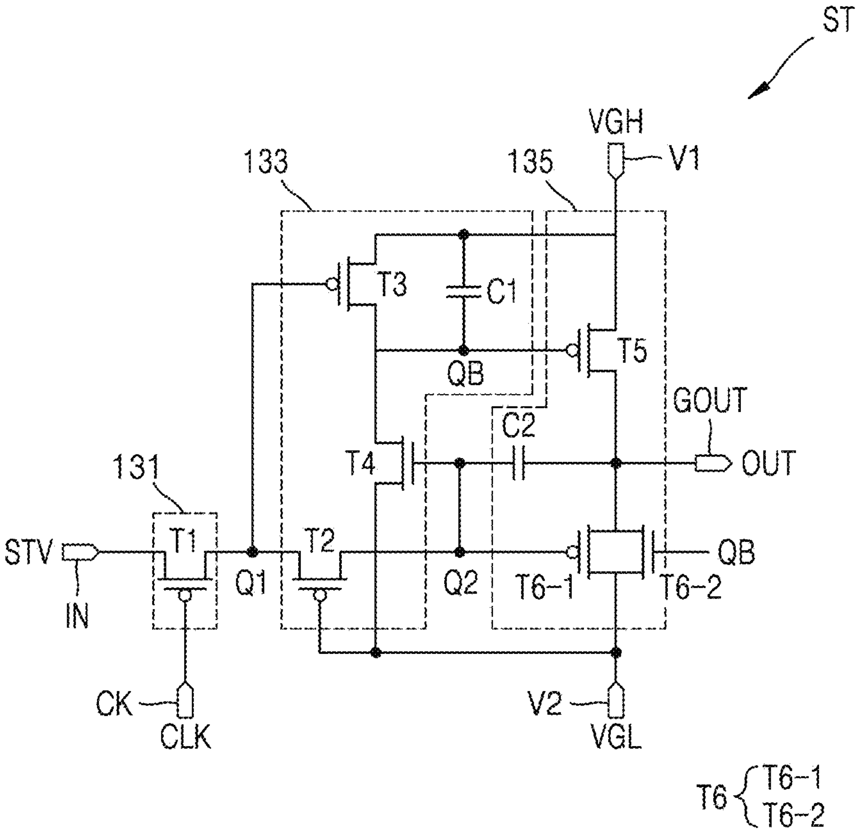
FIG. 3 is a schematic diagram showing an example of a stage included in the driving circuit of FIG. 1.
Figure 4:
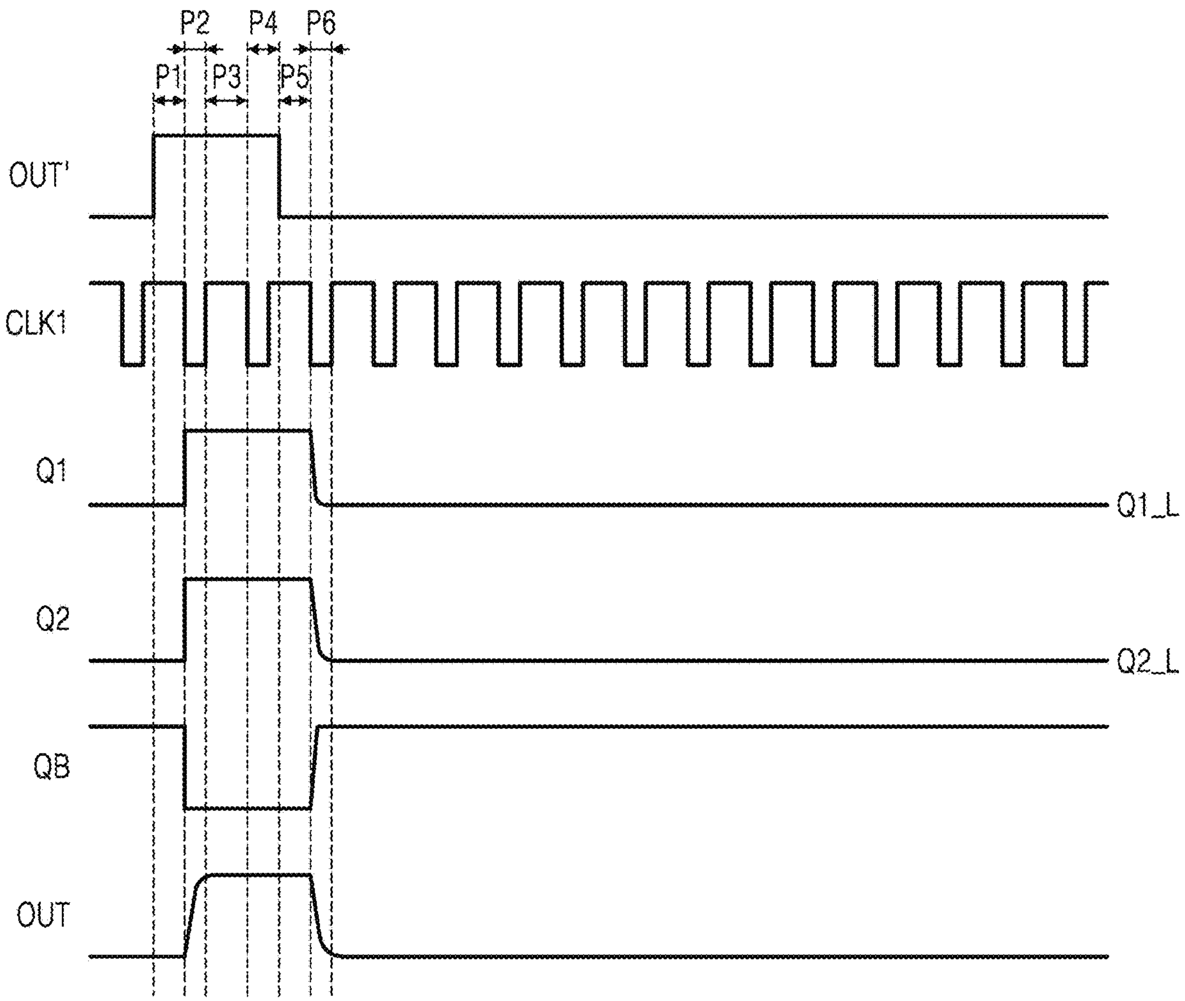
FIG. 4 is a signal timing diagram illustrating the driving of the stage of FIG. 3.

FIG. 3 is a schematic diagram showing an example of a stage ST included in the driving circuit of FIG. 1. FIG. 4 is a signal timing diagram illustrating the driving of the stage ST of FIG. 3.

Referring to FIG. 3, an embodiment of the stage ST may include an input circuit 131, a control circuit 133, and an output circuit 135. The input circuit 131, the control circuit 133, and the output circuit 135 may each include at least one transistor. The at least one transistor may include an N-channel transistor and/or a P-channel transistor. In an embodiment, the conductivity type (the impurity conductivity type) of a fourth transistor T4 of the stage ST may be opposite to that of the remaining transistors. In an embodiment, for example, the fourth transistor T4 may be an N-channel transistor, and a first transistor T1, a second transistor T2, a third transistor T3, a fifth transistor T5, and a sixth transistor T6 may each be a P-channel transistor.

The P-channel transistor may include a silicon transistor. The silicon transistor may include a silicon semiconductor, and the silicon semiconductor may include amorphous silicon, polysilicon, or the like. For example, the silicon transistor may include a low temperature polycrystalline silicon (LTPS) thin-film transistor.

The N-channel transistor may include an oxide transistor. The oxide transistor may include an oxide semiconductor, and the oxide semiconductor is a zinc (Zn) oxide-based material and may include Zn oxide, indium (In)—Zn oxide, gallium (Ga)—In—Zn oxide, or the like. In some embodiments, the oxide semiconductor may include an In—Ga—Zn-oxide (O) (IGZO) semiconductor. In some embodiments, the oxide semiconductor may include an In-tin (Sn)—Ga—Zn—O (ITGZO) semiconductor. For example, the oxide transistor may include a low temperature polycrystalline oxide (LTPO) thin-film transistor.

A gate-on voltage of the P-channel transistor may be a low-level voltage, and a gate-off voltage of the P-channel transistor may be a high-level voltage. A gate-on voltage of the N-channel transistor may be a high-level voltage, and a gate-off voltage of the N-channel transistor may be a low-level voltage.

The input circuit 131 may transmit a signal input to the input terminal IN to a first node Q1. In an embodiment, for example, the input circuit 131 may transmit a start signal STV (e.g., the external signal FLM or a previous output signal OUT' (see FIG. 4)) to the first node Q1 in response to a clock signal CLK. In an embodiment, the input circuit 131 may include the first transistor T1.

The first transistor T1 may be connected between the input terminal IN and the first node Q1. The first transistor T1 may be connected to the input terminal IN and the first node Q1. A gate of the first transistor T1 may be connected to the clock terminal CK. The first transistor T1 may be turned on when the clock signal CLK input to the clock terminal CK is at a low level, and may be configured to transmit, to the first node Q1, the start signal STV input to the input terminal IN. The clock signal CLK may be the first clock signal CLK1 or the second clock signal CLK2. In an embodiment, the first clock signal CLK1 may be input to clock terminals CK of odd-numbered stages ST, and the second clock signal CLK2 may be input to clock terminals CK of even-numbered stages ST. In an embodiment, the second clock signal CLK2 may be input to the clock terminals CK of the odd-numbered stages ST, and the first clock signal CLK1 may be input to the clock terminals CK of the even-numbered stages ST.

The control circuit 133 may control the voltages of a second node Q2 and a third node QB based on the voltage of the first node Q1. The control circuit 133 may include second to fourth transistors T2 to T4. The control circuit 133 may further include a first capacitor C1.

The second transistor T2 may be connected between the first node Q1 and the second node Q2. The second transistor T2 may be connected to the first node Q1 and the second node Q2. A gate of the second transistor T2 may be connected to the second voltage input terminal V2. The second transistor T2 may be turned on in response to the second voltage VGL input to the second voltage input terminal V2, and may be configured to transmit, to the second node Q2, the start signal STV transmitted through the first transistor T1.

The third transistor T3 may be connected between the first voltage input terminal V1 and the third node QB. The third transistor T3 may be connected to the first voltage input terminal V1 and the third node QB. A gate of the third transistor T3 may be connected to the first node Q1. The third transistor T3 may be turned on when the start signal STV transmitted to the first node Q1 is at a low level, and may be configured to transmit, to the third node QB, the first voltage VGH input to the first voltage input terminal V1. Due to the third transistor T3, the voltage level of the third node QB may be opposite to the voltage level of the first node Q1.

The fourth transistor T4 may be connected between the third node QB and the second voltage input terminal V2. The fourth transistor T4 may be connected to the third node QB and the second voltage input terminal V2. A gate of the fourth transistor T4 may be connected to the second node Q2. The fourth transistor T4 may be turned on when the voltage of the second node Q2 is at a high level, and may be configured to transmit, to the third node QB, the second voltage VGL input to the second voltage input terminal V2.

Due to the fourth transistor T4, the voltage level of the third node QB may be opposite to the voltage level of the second node Q2.

The third transistor T3 and the fourth transistor T4 may be configured to control the voltage (the voltage level) of the third node QB based on the voltage of the first node Q1 or the second node Q2, and may thus function as an inverter or a level shifter.

The first capacitor C1 may be connected between the first voltage input terminal V1 and the third node QB. The first capacitor C1 may be connected to the first voltage input terminal V1 and the third node QB. The first capacitor C1 may stably maintain the voltage of the third node QB.

The output circuit 135 may be connected between the first voltage input terminal V1 and the second voltage input terminal V2. The output circuit 135 may be configured to output the output signal OUT having a high-level voltage or a low-level voltage based on the voltages of the second node Q2 and the third node QB. The output circuit 135 may include the fifth transistor T5 and a sixth transistor T6. The output circuit 135 may further include a second capacitor C2.

The fifth transistor T5 may be connected between the first voltage input terminal V1 and the output terminal GOUT. The fifth transistor T5 may be connected to the first voltage input terminal V1 and the output terminal GOUT. A gate of the fifth transistor T5 may be connected to the third node QB. The fifth transistor T5 may be a pull-up transistor that transmits a high-level voltage to the output terminal GOUT. The fifth transistor T5 may be turned on when the voltage of the third node QB is at a low level, and may be configured to transmit the first voltage VGH, which is a high-level voltage input to the first voltage input terminal V1, to the output terminal GOUT.

The sixth transistor T6 may be connected between the output terminal GOUT and the second voltage input terminal V2. The sixth transistor T6 may be connected to the output terminal GOUT and the second voltage input terminal V2. The sixth transistor T6 may be a pull-down transistor that transmits a low-level voltage to the output terminal GOUT.

The sixth transistor T6 may be a transmission gate. The sixth transistor T6 may include a first sub-transistor T6-1 and a second sub-transistor T6-2 connected in parallel with each other. The first sub-transistor T6-1 may be a P-channel transistor, and the second sub-transistor T6-2 may be an N-channel transistor. A gate of the first sub-transistor T6-1 may be connected to the second node Q2, and a gate of the second sub-transistor T6-2 may be connected to the third node QB. The first sub-transistor T6-1 may be turned on when the voltage of the second node Q2 is at a low-level, and may be configured to transmit the second voltage VGL, which is a low-level voltage input to the second voltage input terminal V2, to the output terminal GOUT. The second sub-transistor T6-2 may be turned on when the voltage of the third node QB is at a high-level, and may be configured to transmit the second voltage VGL, which is a low-level voltage input to the second voltage input terminal V2, to the output terminal GOUT.

The second capacitor C2 may be connected between the output terminal GOUT and the second node Q2. The second capacitor C2 may be connected to the output terminal GOUT and the second node Q2.

When the second node Q2 is in a floating state, the second capacitor C2 may change the voltage of the second node Q2 based on the voltage change of the output terminal GOUT by coupling. When the voltage of the output terminal GOUT falls from a high level to a low level, the level of the low-level voltage of the second node Q2 may further decrease due to the coupling of the second capacitor C2. When the low-level voltage of the second node Q2 is prolonged, the level of the low-level voltage of the second node Q2 may increases due to the leakage current of the first transistor T1 and the second transistor T2, and the voltage level of the output signal OUT through the first sub-transistor T6-1 may also increase. In this case, because the voltage of the third node QB is at a high level, the second sub-transistor T6-2 may be turned on, and the low-level voltage of the output signal OUT may be maintained without change through the turned-on second sub-transistor T6-2.

Hereinafter, with reference to FIG. 4, the operation of the stage ST shown in FIG. 3 will be described. For convenience of description, an example in which the stage ST (current stage) in FIG. 3 is an odd stage and the first clock signal CLK1 is input to the clock terminal CK will be described. The start signal of the first odd stage, that is, the first stage ST1, may be the external signal FLM, and the start signal of each of the second and subsequent odd stages may be the previous output signal OUT'.

FIG. 4 is a signal timing diagram of an example in which the stage ST of FIG. 3 is one stage among the second and subsequent odd stages. The operations of the odd stages shown in FIG. 4 may be equally applied to the operations of the even stages with the only difference being that the second clock signal CLK2 is input to the clock terminals CK of the even stage.

In a first section P1, the previous output signal OUT' of high level may be input to the input terminal IN, and the first clock signal CLK1 of high level may be input to the clock terminal CK.

The first transistor T1 may be turned off by the first clock signal CLK1 of high level, the voltages of the first node Q1 and the second node Q2 may be maintained at a low level as in the previous section, and the output signal OUT of low level may be output through the sixth transistor T6. The voltage of the third node QB may be at a high level due to the turned-on third transistor T3.

In a second section P2, the previous output signal OUT' of high level may be input to the input terminal IN, and the first clock signal CLK1 of low level may be input to the clock terminal CK.

The first transistor T1 may be turned on by the first clock signal CLK1 of low level. The second transistor T2 may be turned on by the second voltage VGL of low level. Due to the turned-on first transistor T1 and the turned-on second transistor T2, the previous output signal OUT' of high level may be transmitted to the first node Q1 and the second node Q2, and the first sub-transistor T6-1 of the six transistor T6 may be turned off.

The third transistor T3 having a gate connected to the first node Q1 may be turned off and the fourth transistor T4 having a gate connected to the second node Q2 may be turned on, and thus, the voltage of the third node QB may be the second voltage VGL of low level. The second sub-transistor T6-2 having a gate connected to the third node QB may be turned off. The fifth transistor T5 having a gate connected to the third node QB may be turned on, and the first voltage VGH of high level may be transmitted to the output terminal GOUT. Accordingly, the output signal OUT of high level may be output from the output terminal GOUT.

In a third section P3, the previous output signal OUT' of high level may be input to the input terminal IN, and the first clock signal CLK1 of high level may be input to the clock terminal CK.

The first transistor T1 may be turned off by the first clock signal CLK1 of high level, and the second transistor T2 may be turned on by the second voltage VGL of low level. The voltages of the first node Q1 and the second node Q2 may be maintained at a high level in the second period P2, and the sixth transistor T6 may remain turned off. The fourth transistor T4 having a gate connected to the second node Q2 may remain turned on, and the voltage of the third node QB may be maintained at a low level. Accordingly, the output signal OUT of high level may be output from the output terminal GOUT through the turned-on fifth transistor T5.

In a fourth section P4, the previous output signal OUT' of high level may be input to the input terminal IN, and the first clock signal CLK1 of low level may be input to the clock terminal CK.

The first transistor T1 may be turned on by the first clock signal CLK1 of low level. The second transistor T2 may be turned on by the second voltage VGL of low level. Due to the turned-on first transistor T1 and the turned-on second transistor T2, the previous output signal OUT' of high level may be transmitted to the first node Q1 and the second node Q2, and the first sub-transistor T6-1 of the six transistor T6 may be turned off.

The third transistor T3 having a gate connected to the first node Q1 may be turned off and the fourth transistor T4 having a gate connected to the second node Q2 may be turned on, and thus, the voltage of the third node QB may be the second voltage VGL of low level. The second sub-transistor T6-2 having a gate connected to the third node QB may be turned off. The fifth transistor T5 having a gate connected to the third node QB may be turned on, and the first voltage VGH of high level may be transmitted to the output terminal GOUT. Accordingly, the output signal OUT of high level may be output from the output terminal GOUT.

In a fifth section P5, the previous output signal OUT' of low level may be input to the input terminal IN, and the first clock signal CLK1 of high level may be input to the clock terminal CK.

The previous output signal OUT' transitions from high level to low level, but the first clock signal CLK1 of high level is input to the clock terminal CK such that the first transistor T1 is turned off. Therefore, regardless of the voltage level of the previous output signal OUT', the operation of the stage ST may be the same as the operation of the stage ST during the third section P3. The voltages of the first node Q1 and the second node Q2 may be high-level voltages, and the voltage of the third node QB may be a low level voltage. Accordingly, the output signal OUT of high level may be output from the output terminal GOUT due to the turned-on fifth transistor T5.

In a sixth section P6, the previous output signal OUT' of low level may be input to the input terminal IN, and the first clock signal CLK1 of low level may be input to the clock terminal CK.

The first transistor T1 may be turned on by the first clock signal CLK1 of low level, and the second transistor T2 may be turned on by the second voltage VGL of low level. Due to the turned-on first transistor T1 and the turned-on second transistor T2, the previous output signal OUT' of low level may be transmitted to the first node Q1 and the second node Q2, and the voltages of the first node Q1 and the second node Q2 may be low-level voltages. Accordingly, the first sub-transistor T6-1 may be turned on, and the output signal OUT of low level may be output from the output terminal GOUT through the turned-on first sub-transistor T6-1. When the voltage level of the first node Q1 reaches the level of the second voltage VGL, the second transistor T2 may be turned off, and as a voltage at the output terminal GOUT falls from high level to low level, the second node Q2 may be bootstrapped downward due to the coupling of the second capacitor C2, and thus, the voltage level of the second node Q2 may further decrease. Accordingly, a low level Q2_L of the voltage of the second node Q2 may be less than a low level Q1_L of the voltage of the first node Q1.

The third transistor T3 having a gate connected to the first node Q1 may be turned on, and the fourth transistor T4 having a gate connected to the second node Q2 may be turned off. The voltage of the third node QB through the turned-on third transistor T3 may be the first voltage VGH of high level. Additionally, the fifth transistor T5 having a gate connected to the third node QB may be turned off, and the second sub-transistor T6-2 may be turned on.

Figure 5:
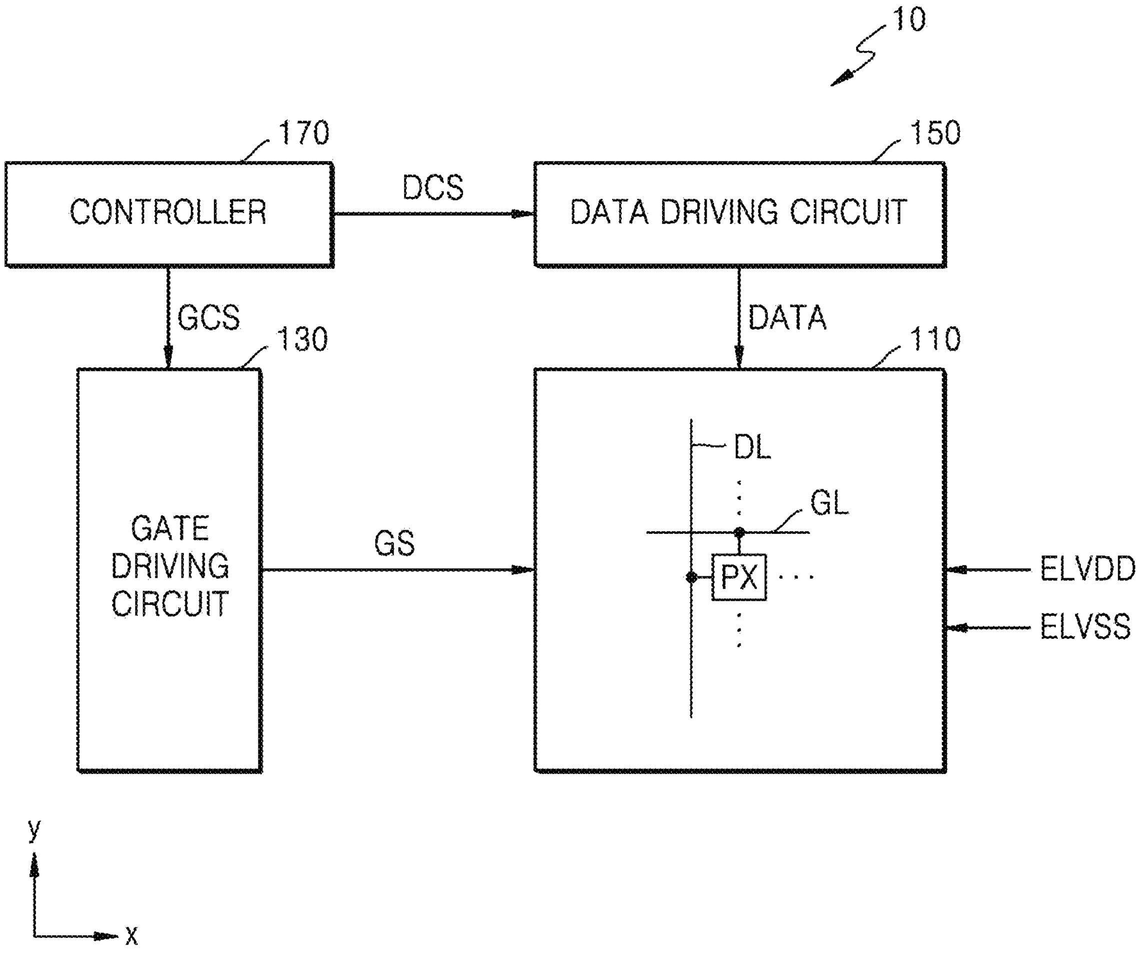
FIG. 5 is a schematic diagram of a display apparatus according to an embodiment.
Figure 6A:
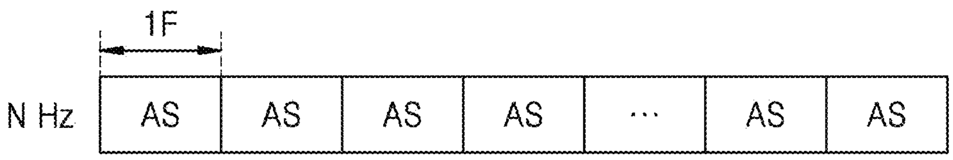
FIGS. 6A to 6C are conceptual diagrams illustrating an embodiment of a method of driving a display apparatus with multiple driving frequencies.
Figure 6B:
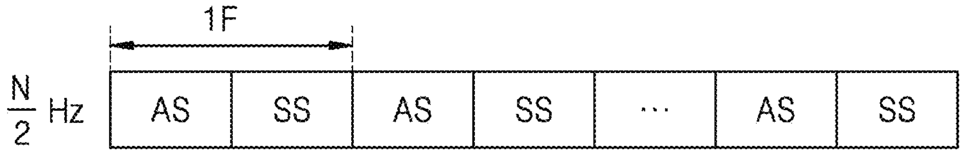
Figure 6C:
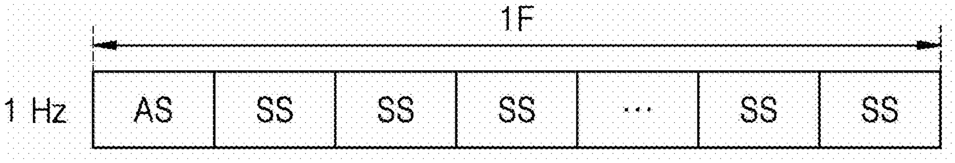

FIG. 5 is a schematic diagram of a display apparatus 10 according to an embodiment. FIGS. 6A to 6C are conceptual diagrams illustrating an embodiment of a method of driving the display apparatus 10 with multiple driving frequencies.

The display apparatus 10 according to an embodiment may be a display apparatus, such as an organic light-emitting display apparatus, an inorganic light-emitting display apparatus (or an inorganic electroluminescent (EL) display apparatus), or a quantum dot lot-emitting display apparatus.

Referring to FIG. 5, the display apparatus 10 according to an embodiment may include a pixel area 110, a gate driving circuit 130, a data driving circuit 150, and a controller 170.

The pixel area 110 may correspond to a display area that displays an image. In a peripheral area (or non-display area) outside the display area, various conductive lines that transmit electrical signals to be applied to the display area, external driving circuits electrically connected to pixel circuits, and pads to which a printed circuit board or driver integrated circuit (IC) chip is attached may be arranged. In an embodiment, for example, a gate driving circuit 130, a data driving circuit 150, and a controller 170 may be provided in the peripheral area.

A plurality of gate lines GL, a plurality of data lines DL, and a plurality of pixels PX connected to the gate lines GL and the data lines DL may be arranged in the pixel area 110. In an embodiment, no pixel is disposed in the peripheral area (or non-display area). The plurality of pixels PX may be repeatedly arranged in a first direction (i.e., an x direction or a row direction) and a second direction (i.e., a y direction or a column direction). The plurality of pixels PX may be arranged in one of various forms, such as a stripe arrangement, a PENTILE® arrangement, a diamond arrangement, and a mosaic arrangement, to display an image. Each of the plurality of pixels PX may include a display element, for example, an organic light-emitting diode, and the organic light-emitting diode may be connected to a pixel circuit. The pixel circuit may include a plurality of transistors and at least one capacitor. The pixel PX may emit, for example, red, green, blue, or white light through the organic light-emitting diode. Each pixel PX may be connected to a corresponding gate line among the plurality of gate lines GL and a corresponding data line among the plurality of data lines DL.

In an embodiment, a plurality of transistors included in the pixel circuit may be P-channel transistors (P-channel silicon transistors). In an embodiment, the plurality of transistors included in the pixel circuit may be N-channel transistors (N-channel oxide transistors). In an embodiment, at least one of the plurality of transistors included in the pixel circuit may be P-channel silicon transistors, and others of the plurality of transistors may be N-channel oxide transistors.

The gate lines GL may each extend in the x direction (the row direction) and be connected to pixels PX located in the same row. The gate lines GL may each transmit a gate signal to the pixels PX in the same row. The data lines DL may each extend in the y direction (the column direction) and be connected to pixels PX located in a same column. The data lines DL may respectively transmit data signals to the pixels PX in a same column in synchronization with the gate signal.

The gate driving circuit 130 may be connected to the plurality of gate lines GL, generate gate signals GS in response to a gate driving control signal GCS from the controller 170, and supply the gate signals GS to the plurality of gate lines GL. The gate line GL may be connected to a gate of a transistor included in the pixel PX, and the gate signal GS may be a gate control signal that controls the turn-on and turn-off of the transistor to which the gate line is connected. The gate signal GS may include a gate-on voltage at which the transistor may be turned on and a gate-off voltage at which the transistor may be turned off. The gate driving circuit 130 may include a plurality of stages that sequentially generate and output the gate signal GS.

The data driving circuit 150 may be connected to the plurality of data lines DL and may supply a data signal DATA to the data lines DL in response to a data driving control signal DCS from the controller 170. The data signals DATA supplied to the data lines DL may be supplied to pixels PX to which the gate signal GS is supplied. The data driving circuit 150 may convert input image data having gray levels, which is input from the controller 170, into a data signal DATA in an analog form, e.g., in the form of voltage or current.

When the display apparatus 10 is an organic light-emitting display apparatus, a first power voltage ELVDD and a second power voltage ELVSS may be supplied to the pixels PX of the pixel area 110. The first power voltage ELVDD may be a high-level voltage provided to one terminal of a driving transistor connected to a first electrode (i.e., a pixel electrode or anode) of the organic light-emitting diode of each pixel PX. The second power voltage ELVSS may be a low-level voltage provided to a second electrode (i.e., an opposite electrode or cathode) of the organic light-emitting diode connected to the other terminal of the driving transistor. The first power voltage ELVDD and the second power voltage ELVSS may be driving voltages for the plurality of pixels PX to emit light. The first power voltage ELVDD and the second power voltage ELVSS may be input from the controller 170 and/or a power supply circuit (not shown).

The controller 170 may generate the gate driving control signal GCS and the data driving control signal DCS based on signals input from the outside. The controller 170 may supply the gate driving control signal GCS to the gate driving circuit 130 and the data driving control signal DCS to the data driving circuit 150. The gate driving control signal GCS may include a plurality of clock signals and a start signal. The data driving control signal DCS may include a plurality of clock signals and a start signal.

The display apparatus 10 may include a display panel, and the display panel may include a substrate. Pixels PX may be arranged in a display area of the substrate. A portion of the gate driving circuit 130 or the entire gate driving circuit 130 may be directly formed in a peripheral area of the substrate during the process of forming transistors constituting a pixel circuit in the display area of the substrate. The data driving circuit 150 and the controller 170 may each be formed in the form of a separate IC chip or may be formed in a single IC chip and may be disposed on a flexible printed circuit board (FPCB) electrically connected to pads disposed on one side of the substrate. In another embodiment, the data driving circuit 150 and the controller 170 may be directly disposed on the substrate by using a chip on glass (COG) or chip on plastic (COP) method.

In an embodiment, the gate driving circuit 130 may be implemented as the driving circuit DRV shown in FIG. 1, which includes the stage ST shown in FIG. 3. In an embodiment, for example, the gate signal GS output by the gate driving circuit 130 to each gate line GL may correspond to the output signal OUT of high level, which is output from each of the plurality of stages ST1 to STn of the driving circuit DRV to a signal line. Each of the stages ST1 to STn may be connected to a gate line disposed in a corresponding row of the pixel area 110. Each of the stages ST1 to STn may generate a gate signal GS and output the gate signal GS to a gate line GL connected thereto. In other words, each of the stages ST1 to STn may supply the gate signal GS to a gate line GL provided in a corresponding row. The first voltage VGH, the second voltage VGL, the first clock signal CLK1, the second clock signal CLK2, and the external signal FLM, which are input to the stages ST1 to STn, may be input from the controller 170 shown in FIG. 5 and/or a power supply circuit (not shown).

The number of stages constituting the gate driving circuit 130 (or the driving circuit DRV shown in FIG. 1) may vary depending on the number of rows (horizontal lines) provided in the pixel area 110.

The display apparatus 10 according to an embodiment may support a variable refresh rate (VRR). Refresh rate is the frequency at which a data signal is actually written to a driving transistor of the pixel PX, and is also called screen scan rate or screen refresh rate. The refresh rate may represent the number of video frames displayed per second. In an embodiment, the refresh rate may be the output frequency of the gate driving circuit 130 and/or the data driving circuit 150. The frequency corresponding to the refresh rate may be a driving frequency. The display apparatus 10 may adjust the output frequency of the gate driving circuit 130 and the output frequency of the data driving circuit 150 corresponding thereto based on multiple driving frequency driving. The display apparatus 10 supporting a VRR may operate by changing the driving frequency within a range of a maximum driving frequency to a minimum driving frequency. In an embodiment, for example, when the refresh rate is about 120 hertz (Hz), a gate signal may be output from the gate driving circuit 130 to each horizontal line (row) in synchronization with the timing of writing a data signal 120 times per second. The display apparatus 10 may display images while changing the driving frequency according to the refresh rate.

Depending on the driving frequency, one frame 1F may include a first scan period AS, or a first scan period AS and one or more second scan periods SS. For example, as shown in FIG. 6A, in the display apparatus 10 operating at a driving frequency of N Hz, one frame 1F may include one first scan period AS. As shown in FIG. 6B, in the display apparatus 10 operating at a driving frequency of N/2 Hz, one frame 1F may include one first scan period AS and one second scan period SS. As shown in FIG. 6C, in the display apparatus 10 operating at a driving frequency of 1 Hz, one frame 1F may include one first scan period AS and N−1 second scan periods SS. The lower the driving frequency, the longer one frame 1F may be. The length of the second scan period SS may be the same as the length of the first scan period AS or may be less than the length of the first scan period AS.

The first scan period AS may be defined as an address scan period, in which a data signal is written to the pixel PX in response to a gate signal that turns on a write transistor in the pixel PX and the pixel PX emits light with a luminance corresponding to the written data signal. The operation of writing a data signal from the data line DL to the pixel PX may also be referred to as a data programming operation.

The second scan period SS may be defined as a self-scan period, in which a data signal is not written to the pixel PX by a gate signal that turns off the write transistor of the pixel PX. During the second scan period SS, a data signal written and stored in the first scan period AS may be maintained in the pixel PX, and the pixel PX may emit light with a luminance corresponding to the data signal written in the first scan period AS.

Figure 7:
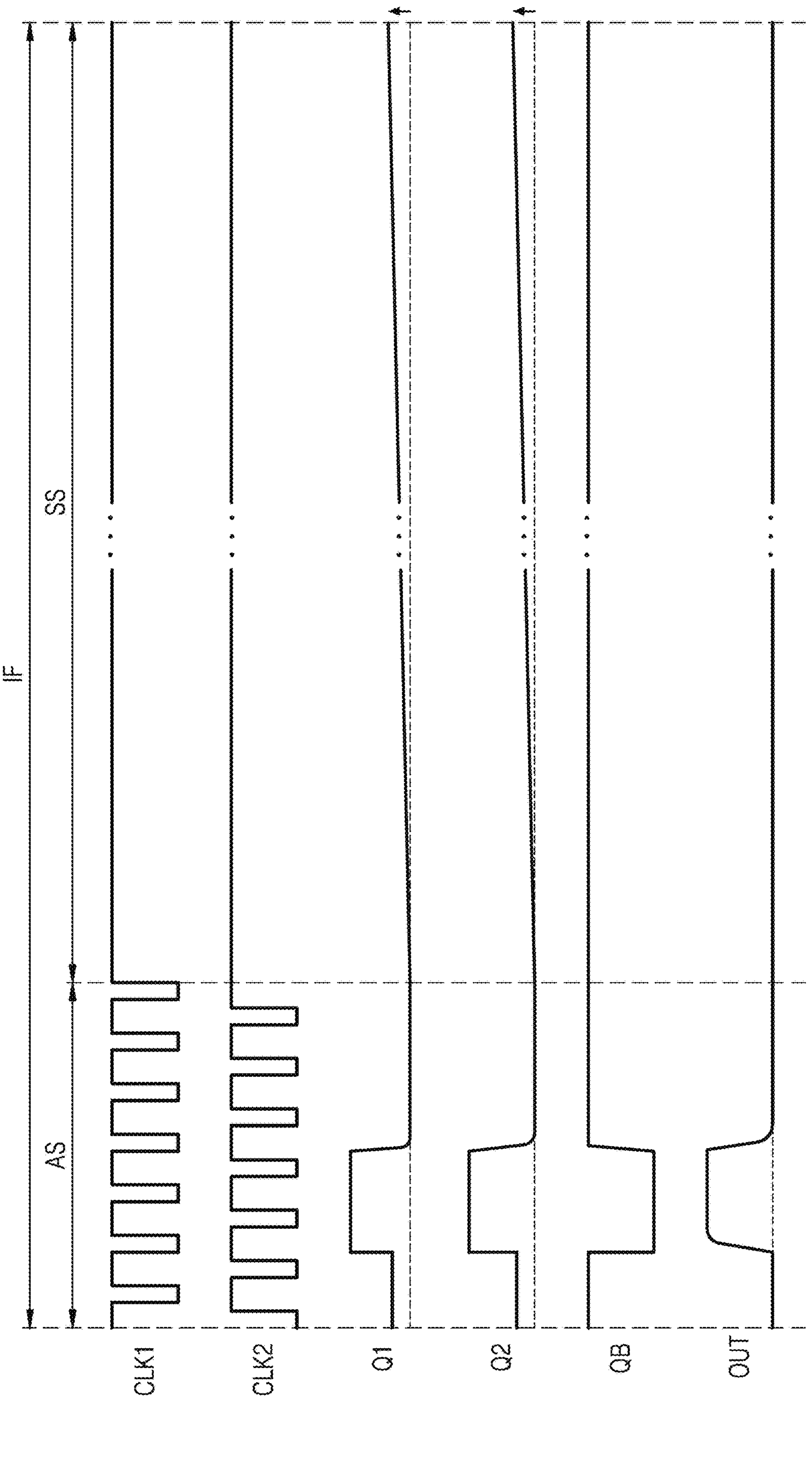
FIG. 7 is a diagram showing input and output signals of a stage when a display apparatus according to an embodiment is driven at low frequency.
Figure 8:
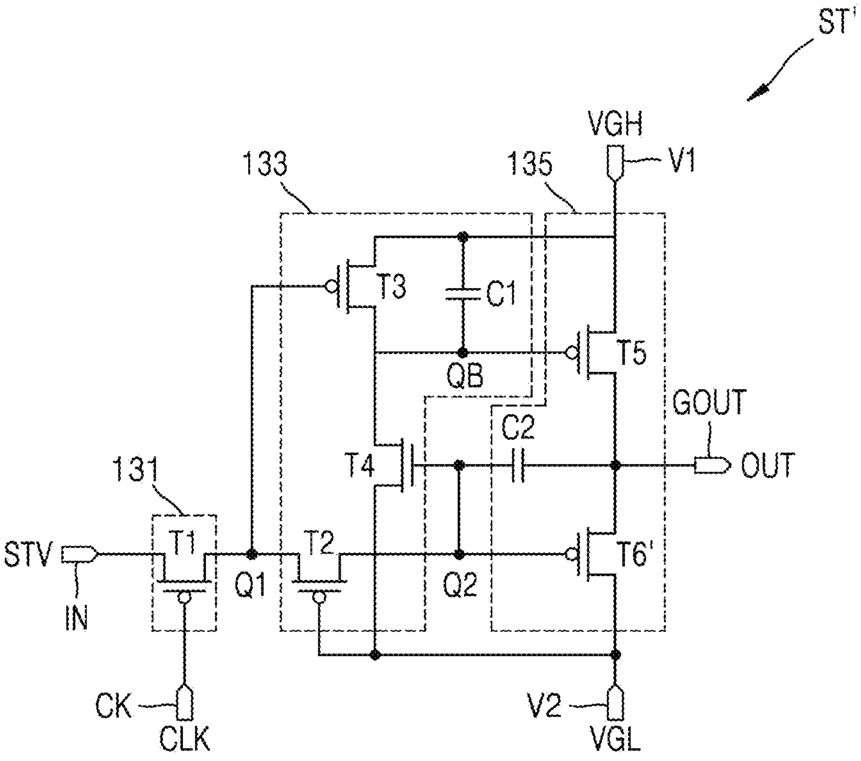
FIG. 8 is a schematic diagram of a stage according to a comparative example.
Figure 9:
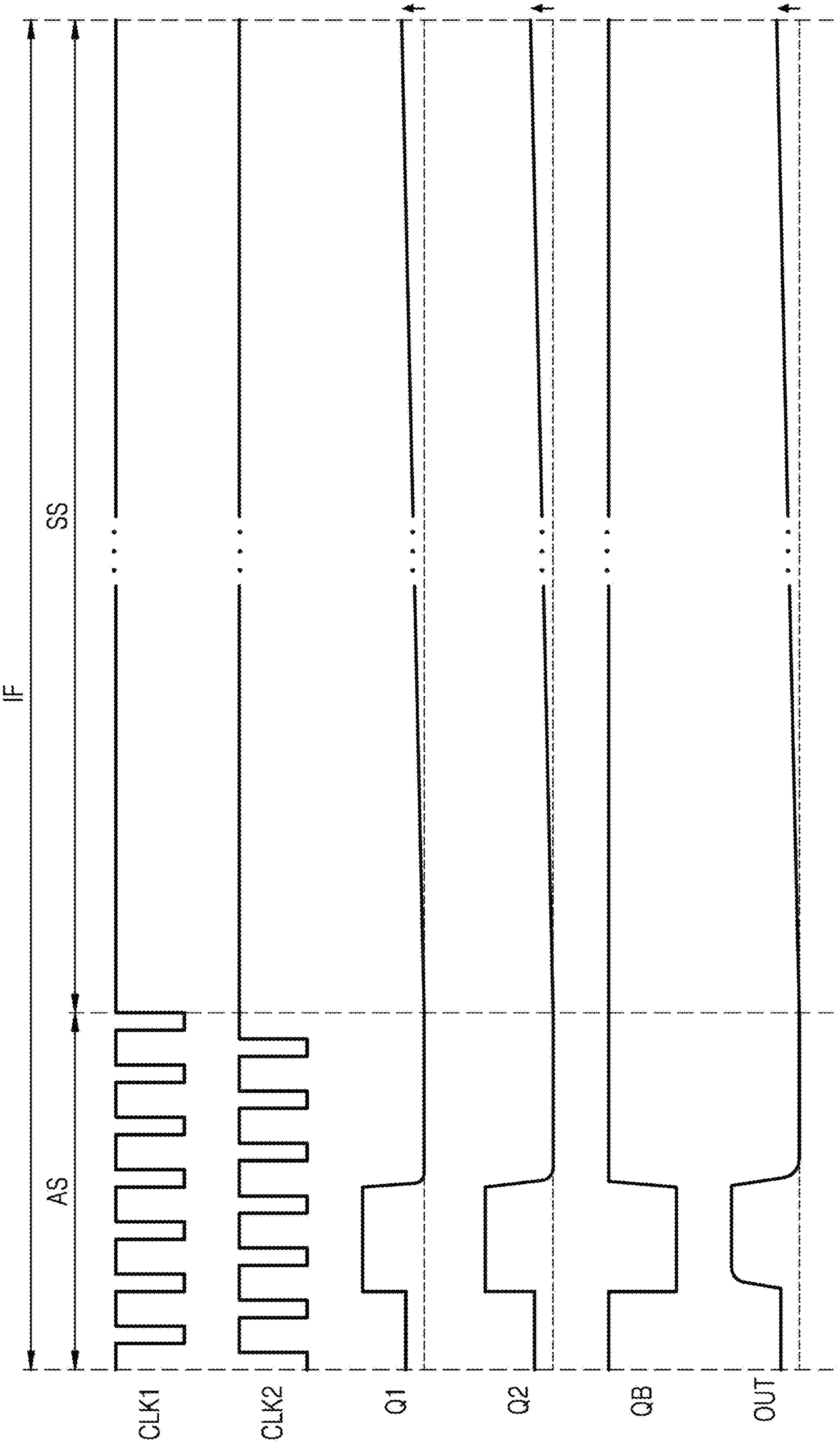
FIG. 9 is a diagram showing input and output signals of a stage when a display apparatus according to the comparative example of FIG. 8 is driven at low frequency.

FIG. 7 is a diagram showing input and output signals of a stage of a gate driving circuit when a display apparatus according to an embodiment is driven at low frequency. FIG. 8 is a schematic diagram of a stage according to a comparative example. FIG. 9 is a diagram showing input and output signals of a stage when a display apparatus according to the comparative example of FIG. 8 is driven at low frequency.

A stage ST' of the comparative example shown in FIG. 8 is different from the stage ST shown in FIG. 3 in that a sixth transistor T6', which is a pull-down transistor, is not a transmission gate. The sixth transistor T6' may be connected between the output terminal GOUT and the second voltage input terminal V2, and a gate of the sixth transistor T6' may be connected to the second node Q2. The sixth transistor T6' may be a P-channel transistor.

As shown in FIG. 7, when the display apparatus 10 operates in a low-frequency driving mode of 1 Hz, the gate driving circuit 130 including the stage ST shown in FIG. 3 may output the output signal OUT of high level as a gate signal during the first scan period AS and output the output signal OUT of low level as a gate signal during the second scan period SS. In an embodiment, the clock signal CLK may not be supplied to the gate driving circuit 130 during the second scan period SS. For example, the clock signal CLK input to the gate driving circuit 130 during the second scan period SS may be a high-level signal (high-level voltage signal).

While the stage ST outputs the output signal OUT of low level in a plurality of second scan periods SS by low-frequency driving, the voltage levels of the first node Q1 and the second node Q2 may increase from the low level due to the leakage current of the first transistor T1 and the second transistor T2. Accordingly, the voltage level of the output signal OUT may increase from the low level.

In an embodiment, the sixth transistor T6, which is a pull-down transistor, may be implemented as a transmission gate. Accordingly, even when the voltage level of the second node Q2 to which the gate of the first sub-transistor T6-1 is connected increases due to the low-frequency driving of the gate driving circuit 130, the N-channel second sub-transistor T6-2 having a gate connected to the third node QB may be turned on and the second voltage VGL of low level may be transmitted to the output terminal GOUT, and thus, the low level of the output signal OUT may be stably maintained.

In the comparative example, as shown in FIG. 9, while the stage ST' of the comparative example shown in FIG. 8 outputs the output signal OUT of low level by repetition of the second scan period SS when driven at a low frequency of 1 Hz, the output signal OUT may gradually increase along with the increase in the voltage levels of the first node Q1 and the second node Q2. As the voltage level of the output signal OUT increases, the luminance of the display apparatus may change or horizontal lines may appear on the screen thereof.

In an embodiment, when a certain signal is input (supplied) to an element, this may mean that the signal is supplied as a gate-on voltage, and when a certain signal is not input (supplied) to the element, this may mean that the signal is supplied as a gate-off voltage. For example, in FIG. 4, when the previous output signal OUT' is supplied, it may mean that the previous output signal OUT is input as a high-level voltage, and when the previous output signal OUT' is not supplied, it may mean that the previous output signal OUT is input as a low-level voltage. Also, when the clock signal CLK is not supplied, it may mean that the clock signal CLK is input as a high-level voltage.

The one or more embodiments may provide a driving circuit that may stably output a gate signal while reducing dead space in a display apparatus by configuring the driving circuit with a small number of transistors and capacitors, and a display apparatus including the driving circuit.

The driving circuit according to one or more embodiments may stably output an output signal without voltage fluctuation even during low-frequency driving because a pull-down transistor of a stage is implemented as a transmission gate. In addition, the driving circuit according to one or more embodiments may receive a clock signal of a constant voltage rather than a clock signal alternating between a high level and a low level when driving at low frequency, and thus, the display apparatus may reduce power consumption due to toggling of the clock signal during low-frequency driving.

According to one or more embodiments, a driving circuit that includes a small number of circuit elements and may stably output a gate signal while reducing the area of a non-display area, and a display apparatus including the driving circuit may be provided.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A driving circuit comprising a plurality of stages, wherein each of the plurality of stages comprises:

a first transistor connected to a first terminal, to which a start signal is input and a first node, wherein the first transistor includes a gate connected to a clock terminal, to which a clock signal is input;

a pull-up transistor connected to a second terminal, to which a first voltage is supplied, and an output terminal;

a pull-down transistor connected to the output terminal and a third terminal, to which a second voltage less than the first voltage is supplied; and a control circuit connected to the first node, a gate of the pull-down transistor, and a gate of the pull-up transistor, wherein the control circuit controls a voltage of the gate of the pull-down transistor and a voltage of the gate of the pull-up transistor based on a voltage of the first node, wherein the pull-down transistor comprises a first sub-transistor and a second sub-transistor connected in parallel with each other, wherein conductivity types of the first sub-transistor and the second sub-transistor are different from each other, wherein a gate of the second sub-transistor and the gate of the pull-up transistor are connected to a same node which is distinct from the first node, and a gate of the first sub-transistor is connected to a second node which is distinct from the first node.

2. The driving circuit of claim 1, wherein the first sub-transistor is a P-channel transistor, and the second sub-transistor is an N-channel transistor.

3. The driving circuit of claim 1, wherein each of the plurality of stages further comprises a first capacitor connected to the output terminal and a second node, to which a gate of the first sub-transistor is connected.

4. The driving circuit of claim 3, wherein the control circuit comprises:

a second transistor connected to the first node and the second node, wherein the second transistor includes a gate connected to the third terminal;

a third transistor connected to the second terminal and a third node, to which the gate of the second sub-transistor is connected, wherein the third transistor includes a gate connected to the first node;

a fourth transistor connected to the third node and the third terminal, wherein the fourth transistor includes a gate connected to the second node; and a second capacitor connected to the second terminal and the third node.

5. The driving circuit of claim 4, wherein in each of the plurality of stages, the fourth transistor and the second sub-transistor are N-channel transistors, and remaining transistors are P channel transistors.

6. The driving circuit of claim 4, wherein, while a low-level output signal is output from the output terminal, voltages of the first node and the second node are at a low level and a voltage of the third node is at a high level, and a voltage level of the second node is lower than a voltage level of the first node.

7. The driving circuit of claim 4, wherein, while a high-level output signal is output from the output terminal, voltages of the first node and the second node are at a high level and a voltage of the third node is at a low level.

8. The driving circuit of claim 1, wherein the clock signal is a first clock signal or a second clock signal, wherein the first clock signal and the second clock signal are signals in which a high-level voltage and a low-level voltage are alternate, and the second clock signal is a signal shifted by a half cycle from the first clock signal, and wherein the first clock signal is input to the clock terminal of each of odd-numbered stages among the plurality of stages, and the second clock signal is input to the clock terminal of each of even-numbered stages among the plurality of stages.

9. The driving circuit of claim 1, wherein, while a low-level output signal is output from the output terminal in a low-frequency driving mode, the clock signal input to the clock terminal is a high-level signal.

10. The driving circuit of claim 1, wherein the start signal is an external signal or a signal output from an output terminal of a previous stage.

11. A driving circuit comprising a plurality of stages, wherein each of the plurality of stages comprises:

a first transistor connected to a first terminal, to which a start signal is input and a first node, wherein the first transistor includes a gate connected to a clock terminal, to which a clock signal is input;

a second transistor connected to the first node and a second node, wherein the second transistor includes a gate connected to a second terminal, to which a first voltage is supplied;

a third transistor connected to a third node and a third terminal, to which a second voltage greater than the first voltage is supplied, wherein the third transistor includes a gate connected to the first node;

a fourth transistor connected to the third node and the second terminal, wherein the fourth transistor includes a gate connected to the second node;

a fifth transistor connected to the third terminal and an output terminal, wherein the fifth transistor includes a gate connected to the third node; and a transmission gate connected to the output terminal and the second terminal, wherein the transmission gate comprises a first sub-transistor and a second sub-transistor connected in parallel with each other, a gate of the first sub-transistor is connected to the second node, and a gate of the second sub-transistor is connected to the third node.

12. The driving circuit of claim 11, wherein the first sub-transistor is a P-channel transistor, and the second sub-transistor is an N-channel transistor.

13. The driving circuit of claim 11, wherein each of the plurality of stages further comprises:

a first capacitor connected to the third terminal and the third node; and a second capacitor connected to the output terminal and the second node.

14. The driving circuit of claim 13, wherein, while a low-level output signal is output from the output terminal, voltages of the first node and the second node are at a low level and a voltage of the third node is at a high level, and a voltage level of the second node is lower than a voltage level of the first node.

15. The driving circuit of claim 13, wherein, while a high-level output signal is output from the output terminal, voltages of the first node and the second node are at a high level and a voltage of the third node is at a low level.

16. The driving circuit of claim 11, wherein in each of the plurality of stages, conductivity types of the fourth transistor and the second sub-transistor are opposite to conductivity types of remaining transistors.

17. The driving circuit of claim 16, wherein in each of the plurality of stages, the fourth transistor and the second sub-transistor are N-channel transistors, and the remaining transistors are P-channel transistors.

18. The driving circuit of claim 11, wherein the clock signal is a first clock signal or a second clock signal, wherein the first clock signal and the second clock signal are signals in which a high-level voltage and a low-level voltage are alternate, and the second clock signal is a signal shifted by a half cycle from the first clock signal, and wherein the first clock signal is input to the clock terminal of each of odd-numbered stages among the plurality of stages, and the second clock signal is input to the clock terminal of each of even-numbered stages among the plurality of stages.

19. The driving circuit of claim 11, wherein, while a low-level output signal is output from the output terminal in a low-frequency driving mode, the clock signal input to the clock terminal is a high-level signal.

20. The driving circuit of claim 11, wherein the start signal is an external signal or a signal output from an output terminal of a previous stage.

* * * * *